United States Patent
Jolec et al.

(10) Patent No.: US 10,230,331 B2
(45) Date of Patent: Mar. 12, 2019

(54) DIGITAL FREQUENCY CONVERTER AND METHOD OF PROCESSING IN A DIGITAL FREQUENCY CONVERTER

(71) Applicant: THALES, Courbevoie (FR)

(72) Inventors: François Jolec, Cholet (FR); Anthony Doumenjou, Cholet (FR)

(73) Assignee: THALES, Courbevoie (FR)

( * ) Notice: Subject to any disclaimer, the term of this patent is extended or adjusted under 35 U.S.C. 154(b) by 77 days.

(21) Appl. No.: 15/329,883

(22) PCT Filed: Jul. 30, 2015

(86) PCT No.: PCT/EP2015/067605
§ 371 (c)(1),
(2) Date: Jan. 27, 2017

(87) PCT Pub. No.: WO2016/016409
PCT Pub. Date: Feb. 4, 2016

(65) Prior Publication Data
US 2017/0272035 A1    Sep. 21, 2017

(30) Foreign Application Priority Data
Jul. 30, 2014    (FR) ...................................... 14 01758

(51) Int. Cl.
*H03D 7/16*    (2006.01)
*H03H 17/02*    (2006.01)
*H03H 17/06*    (2006.01)

(52) U.S. Cl.
CPC ..... *H03D 7/165* (2013.01); *H03D 2200/0062* (2013.01); *H03H 17/0276* (2013.01); *H03H 17/0664* (2013.01); *H03H 2017/0247* (2013.01)

(58) Field of Classification Search
CPC ............... H03B 21/00; H03D 2200/00; H03D 2200/0062; H03D 7/00; H03D 7/12;
(Continued)

(56) References Cited

U.S. PATENT DOCUMENTS

| 5,841,811 A | 11/1998 | Song |
| 2004/0056785 A1 | 3/2004 | Webster et al. |
| 2004/0153487 A1* | 8/2004 | Saha ................... H03H 17/0223 708/306 |

OTHER PUBLICATIONS

International Search Report dated Dec. 14, 2015 in PCT/EP2015/067605.
(Continued)

*Primary Examiner* — Lincoln Donovan
*Assistant Examiner* — David Mattison
(74) *Attorney, Agent, or Firm* — B. Aaron Schulman, Esq.; Stites & Harbison, PLLC

(57) ABSTRACT

A frequency converter comprising a frequency transposition block for samples ($11_{Q\_1}$, $11_{Q\_2}$), a filtering block ($12_{Q\_1}$, $12_{Q\_2}$), the filtered samples y(n) verifying $y(n)=c(0)\cdot x(n)+c(1)\cdot x(n-1)+c(2)\cdot x(n-2)+ \ldots +c(p-1)\cdot x(n-p+1)+c(p)\cdot x(n-p)+c(p-1)\cdot x(n-p-1)+ \ldots + \ldots +c(1)\cdot x(n-2\cdot p+1)+c(0)\cdot x(n-2\cdot p)$, wherein x( ) are the transposed samples and c(0), . . . c(p) are the real coefficients of the filter; and being adapted for, during a cycle for determining the value of the filtered sample y(n):
  calculating the first terms $c(0)\cdot x(n)$, $c(1)\cdot x(n-1)$, $c(2)\cdot x(n-2)$, . . . , $c(p)\cdot x(n-p)$ by multiplying the respective coefficients and transposed samples, and storing in memory said first calculated terms;
  reading the second terms $c(p-1)\cdot x(n-p-1)$, . . . , $c(1)\cdot x(n-2\cdot p+1)$, $c(0)\cdot x(n-2\cdot p)$, calculated and stored in memory during previous cycles for determining the value of filtered samples y(n–m); and
(Continued)

determining y(n) by summation of the first and second terms.

6 Claims, 2 Drawing Sheets

(58) Field of Classification Search
CPC .... H03D 7/125; H03D 7/1408; H03D 7/1441; H03D 7/165
USPC .......................................................... 327/113
See application file for complete search history.

(56) References Cited

OTHER PUBLICATIONS

Langlois, J.M.P, et al., "A high performance, wide bandwidth, low cost FPGA-based quadrature demodulator", Electrical and Computer Engineering, 1999 IEEE Canadian Conference on Edmonton, Alta., Canada May 9-12, 1999, Piscataway, NJ, USA, IEEE, US, May 9, 1999 (May 9, 1999), pp. 497-502 vol. 1, XP032158310, DOI: 10.1109/CCECE.1999.807248 ISBN: 978-0-7803-5579-8 2 Digital Realization of Quadrature Demodulation; 4 Filter Architecture Selection; p. 498, left hand column—p. 501, right-hand column; figures 1-6.

Jorersen, J.H. Ed-Stein T I (ED), "Digital Demodulator for Wide Bandwidth SAR", IGARSS 2000, IEEE 2000 International Geoscience and Remote Sensing Symposium, Honolulu, Hawaii, Jul. 24-28, 2000: [IEEE International Geoscience and Remote Sensing Symposium], New York, NY: IEEE, US, Jul. 24, 2000 (Jul. 24, 2000), pp. 2269-2271, XP000970975, ISBN: 978-0-7803-6360-1 Digital Demodulator: The Lowpass Filter; p. 2269, right-hand column—p. 2270, right hand column; figure 2.

\* cited by examiner

DIGITAL FREQUENCY CONVERTER AND METHOD OF PROCESSING IN A DIGITAL FREQUENCY CONVERTER

The present invention relates to a frequency digital converter.

Such digital converters are used for carrying out a frequency down-conversion, transforming actual samples from an analogue/digital converter and centered on a transposed frequency $f_0$, into complex samples I/Q in a base band, followed by low-pass filtering and decimation.

These frequency digital converters are often implemented on a printed circuit of the array of programmable gates type, further called FPGA ("field-programmable gate array"), operating at a processing speed $F_{FPGA}$ of less than the sampling frequency $F_e$ of the analogue/digital converter. The frequency conversion is therefore not accomplished continuously and in real time, or else it is necessary to limit the sampling frequency by the processing frequency $F_{FPGA}$ if continuous and real time processing is desired.

Sometimes several analogue/digital converter blocks are used at sampling frequencies less than $F_{FPGA}$ in order to have a wide band piece of equipment, but junction problems between the different blocks arise.

With reference to the graph of FIG. 1 illustrating in abscissas the sampling frequency $F_e$ and in ordinates the processing frequency $F_{FPGA}$, and by noting as $F_{FPGA\_MAX}$ the maximum processing value of the FPGA, the hatched area Z1 is the area which may be used during continuous processing and in real time, and the frequency $F_{e1}$ is the maximum sampling frequency which may be used for continuous and real time processing.

Therefore it is desirable to have a digital converter giving the possibility of reducing the number of calculations required for converting on the one hand, and carrying out the processing on the other hand, at the processing frequency $F_{FPGA}$ of the FPGA giving the operating rhythm of the converter, of the samples sampled at a sampling frequency $F_e$ greater than this processing frequency $F_{FPGA}$.

For this purpose, according to a first aspect, the invention proposes a frequency digital converter suitable for receiving signal samples and comprising:

at least one frequency transposition block adapted for transposing in frequency said received samples;

at least one filtering block adapted for filtering said transposed samples and for delivering filtered samples y(n) verifying the formula y(n)=c(0)·x(n)+c(1)·x(n−1)+c(2)·x(n−2)+ . . . +c(p−1)·x(n−p+1)+c(p)·x(n−p)+c(p−1)·x(n−p−1)+ . . . + . . . +c(1)·x(n−2·p+1)+c(0)·x(n−2·p), wherein x( ) are the transposed samples and c(0), . . . c(p) are real coefficients of the filter; and a set of memories, said frequency converter being adapted for, during a cycle for determining the value of the filtered sample y(n), carrying out the operations of calculating the first terms c(0)·x(n), c(1)·x(n−1), c(2)·x(n−2), . . . , c(p)·x(n−p) by multiplying the respective coefficients and transposed samples, and storing at least certain of said first calculated terms in the set of memories;

reading in the set of memories, at least certain of the second terms c(p−1)·x(n−p−1), . . . , c(1)·x(n−2·p+1), c(0)·x(n−2·p), calculated and stored during previous cycles for determining the value of filtered samples y(n−m), with m being a strictly positive integer; and determining y(n) by summing the first and second terms.

Such a converter, by making use of the properties of the symmetrical filters gives the possibility of reducing the calculation volume to be carried out and therefore limiting the resources required for the conversion.

In embodiments, the frequency digital converter according to the invention further includes one or several of the following features:

the converter is adapted for receiving real sampled samples of the signal and for delivering complex signals I/Q, stemming from the filtering by the filtering block after transposition with the transposition block, of said real sampled samples, said converter including parallel chains for processing the signals I and the signals Q, at least one of said processing chains I, Q comprising V parallel routes each adapted for carrying out a frequency transposition, said power converter being adapted for selectively distributing the real samples among said routes, each real sample being provided to the $i^{th}$ route, i=1 to V, n being a positive integer;

the converter is adapted for operating in a clocked way by a frequency clock signal, a so called operating frequency, and adapted for receiving the sampled real samples according to a sampling frequency, V being equal to the quotient of the sampling frequency by the operating frequency;

the frequency transposition comprises a multiplication of the samples by a sine or cosine with a frequency equal to $F_e/4$, V/2 routes thereby delivering always zero transposed samples;

at least the $k^{th}$ and $j^{th}$ parallel routes of said processing chain, k≠j and k, j being integers between 1 and N, comprise a filtering sub-block adapted for determining the filtered signal y(N·n+i−1)=c(0)·x(N·n+i−1)+c(1)·x(N·n+i−1−1)+c(2)·x(N·n+i−1−2)+ . . . +c(p−1)·x(N·n+i−p)+c(p)·x(N·n+i−1−p)+c(p−1)·x(N·n+i−1−p−1) . . . +c(1)·x(N·n+i−1−2·p+1) c(0)·x(N·n+i−1−2·p), wherein x( ) are signals stemming from the transposition in said processing chain, with i=j on the $j^{th}$ route, and i=k on the $k^{th}$ route, the filtering sub-block ($12_{Q\_1}$, $12_{Q\_2}$) of the $k^{th}$ route, respectively of the $j^{th}$ route, being adapted for calculating the first terms c(0)·x(N·n+i−1), . . . ,c(p)·x(N·n+i−1−p) by multiplying the respective transposed samples and coefficients, in order to store at least certain of said first calculated terms in the set of memories and for reading, in the set of memories, at least certain of the second terms c(p−1)·x(N·n+i−1−p−1), . . . , c(0)·x(N·n+i−1−2·p), calculated and stored during previous cycles for determining the value of filtered samples y(n−m), with m being a strictly positive integer, certain of said second terms having been calculated by the filtering block ($12_{Q\_1}$, $12_{Q\_2}$) of the $j^{th}$ route, respectively of the $k^{th}$ route.

According to a second aspect, the present invention proposes a processing method in a frequency converter adapted for receiving signal samples, the method comprising the following steps:

receiving signal samples;

frequency transposition of said received samples;

filtering said transposed samples, the filtered samples y(n) verifying the formula y(n)=c(0)·x(n)+c(1)·x(n−1)+c(2)·x(n−2)+ . . . +c(p−1)·x(n−p+1)+c(p)·x(n−p)+c(p−1)·x(n−p−1)+ . . . + . . . +c(1)·x(n−2·p+1)+c(0)·x(n−2·p), wherein x( ) are the transposed samples and c(0), . . . c(p) are real coefficients of the filter;

said processing method comprising the following steps, during a cycle for determining the value of the filtered sample y(n):

calculating the first terms c(0)·x(n), c(1)·x(n−1), c(2)·x(n−2), . . . , c(p)·x(n−p) by multiplying the respective coefficients and transposed samples, and storing at least certain of said first calculated terms in a set of memories;

reading, in the set of memories, at least certain of the second terms $c(p-1) \cdot x(n-p-1), \ldots, c(1) \cdot x(n-2 \cdot p+1), c(0) \cdot x(n-2 \cdot p)$, calculated and stored during previous cycles for determining the value of filtered samples $y(n-m)$, with m being a strictly positive integer; and determining $y(n)$ by summing the first and seconds terms.

These features and advantages of the invention will become apparent upon reading the description which follows, only given as an example, and made with reference to the appended drawings, wherein:

FIG. 2 is a view of a frequency converter of the down type 10 in an embodiment of the invention.

Figure 1:
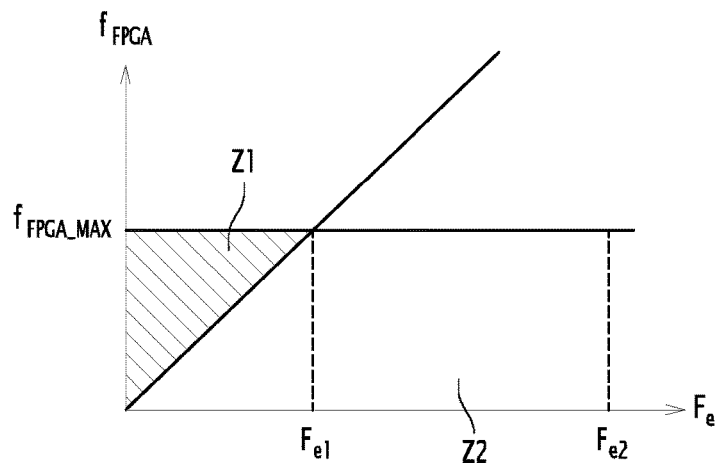
FIG. 1 represents a graph illustrating the relationship between the sampling frequency and the processing frequency in the prior art on the one hand and according to the invention on the other hand.

The frequency converter of the digital down type 10 or DDC (<<Digital Down Converter>>) 10 is adapted for receiving as an input real samples $z(n)$ in a transposed band.

The DDC ("Digital Down Converter") 10 is adapted for delivering at the output complex samples $Z(n)$ in a base band, i.e. for which the spectrum is centered on 0.

$z(n)$ is the sample corresponding to the sampling time $t_n = n/F_e$ and $Z(n)$ is the sample delivered at $T_{init} + n/F_e$ wherein n is a positive integer and the initial sampling instant.

Each complex sample is written as $Z(n) = I(n) + i \cdot Q(n)$, wherein $I(n)$ is the in-phase component and $Q(n)$ is the quadrature component.

The spectrum of these samples $z(n)$ is thus centered around the carrier frequency $f_0$.

The sampling frequency $F_e$ of these samples $z(n)$ is for example the sampling frequency of an analogue/digital converter located upstream from the DDC 10.

The DDC 10 is an integral part of a FPGA and its operations are clocked by a clock signal of the FPGA having a frequency equal to $F_{FPGA}$, designated as a processing frequency.

DDC 10 is adapted for continuously processing in real time the received samples $z(n)$. The DDC 10 includes a processing route $V_I$ and a processing route $V_Q$.

The DDC 10 is adapted for providing each real sample $z(n)$ at the input of each processing route $V_I$ and $V_Q$.

The DDC 10 comprises, on the route $V_I$, a base band transposition block $11_I$, a low pass filter $12_I$ and a decimating block $13_I$.

The DDC 10 comprises, on the route $V_Q$, a base band transposition block $11_Q$, a low pass filter $12_Q$ and a decimating block $13_Q$.

The frequency transposition block $11_I$ si adapted for multiplying a real sample $z(n)$ received at the input with a cosine function at the frequency $f_0$: $\cos(2\pi f_0 t_n)$.

The frequency transposition block $11_Q$ is adapted for multiplying a real sample $z(n)$ with the sine function at the frequency $f_0$: $-\sin(2\pi f_0 t_n)$.

Each decimating block $13_I$, $13_Q$ is adapted for reducing the number of samples, in the relevant case, the number of samples is reduced by a factor 2. This decimation reduces the clocking on the route I, respectively Q, from 800 MHz to 400 MHz.

In the relevant case, each filter $12_I$, $12_Q$ is a finite impulse response filter, a so called FIR ("Finite Impulse Response") filter.

The output $y(n)$ of each of these filters $12_I$, $12_Q$ is written in the form of a same linear combination function of the input signal $x(n)$ of the filter:

$$y(n) = c(0) \cdot x(n) + c(1) \cdot x(n-1) + c(2) \cdot x(n-2) \ldots + c(M-1) \cdot x(n-M+1) \quad \text{(formula 1)}$$

wherein M is a positive integer.

In the described embodiment, each filter is a symmetrical filter, with the following properties:
the number M of coefficients is odd: $M = 2 \cdot p + 1$ with p being a positive integer;
the coefficients are real numbers and are symmetrical $c(i) = c(2 \cdot p - i)$ $i = 0$ to p;
the odd coefficients are zero except if the odd coefficient is from among $c(p)$ and $c(p+1)$.

In the described embodiment, each filter is further normalized by the value of the central coefficient $c(p)$.

The formula giving $y(n)$ may therefore be written as:

$$y(n) = c(0) \cdot x(n) + c(1) \cdot x(n-1) + c(2) \cdot x(n-2) + \ldots + c(p-1) \cdot x(n-p+1) + c(p) \cdot x(n-p) + c(p-1) \cdot x(n-p-1) \ldots + c(1) \cdot x(n-2 \cdot p+1) + c(0) \cdot x(n-2 \cdot p).$$

It is noted that the last p terms of the linear combination, starting from the term $c(p-1) \cdot x(n-p-1)$ until the term $c(0) \cdot x(n-2 \cdot p)$ are terms used for determining previous outputs of the filter:

$c(0) \cdot x(n-2 \cdot p)$ enters the calculation of $y(n-2 \cdot p)$,
$c(1) \cdot x(n-2 \cdot p+1)$ enters the calculation of $y(n-2 \cdot p+2)$,
$c(p-1) \cdot x(n-p-1)$ enters the calculation of $y(n-2)$; and
more generally $c(i) \cdot x(n-2p+i)$ enters the calculation of $y(n-2p+2i)$, $i=0$ to $p-1$.

Similarly, the first p terms of the linear combination, from the term $c(0) \cdot x(n)$ up to the term $c(p-1) \cdot x(n-p+1)$ are terms used for determining the subsequent outputs of the filter.

According to an aspect of the invention, the number of multiplications to be performed, and therefore the number of multipliers to be set into place will be reduced by setting into place, during the calculation of an output $y(n)$ of the filter, the storage in memory of the first p terms of the linear combination following their calculation, called hereafter intermediate results, and extraction and reuse of the intermediate results stored in memory previously during the calculation of the preceding outputs, in order to determine the last p terms of the linear combination.

The DDC 10 according to the invention is adapted for producing processing operations on each route parallel to the frequency $F_{FPGA}$ and delivering at the output a flow I and a flow Q, each flow being a continuous flow and in real time of samples at $F_e/2$.

In the relevant particular case:
p is selected to be equal to 27, the number of coefficients is therefore equal to 55;
the coefficients are the following: $c(0), c(1), c(2), \ldots, c(25), c(26), c(27), c(28), c(29), \ldots, c(52), c(53), c(54)$;
$c(0), c(2), \ldots, c(52), c(54)$ have a value between $-1$ and $1$ after normalization with the central coefficient $c(27)$;
the odd coefficients are zero $c(1) = c(3) = \ldots = c(25) = c(29) = \ldots = c(51) = c(53) = 0$ except if $c(27)$ is equal to 1 following the normalization of the coefficients;

the transposed frequency $f_0$ is equal to 200 MHz, the sampling frequency $F_e$ is equal to 800 MHz, the processing frequency $F_{FPGA}$ of the FGPA is equal to 200 MHz.

But the invention may of course be applied with other values for p and these frequencies.

Successive samples y(n), y(n+1) on the route I at the output of the filter $12_I$ are therefore written as depending on the samples x(i) at the input of the filter $12_I$ because the transposition gives rise to a sample equal to 0 every two samples because of the value of the $2\pi\, f_0 t_i$:

$$y(n) = c(0)*x(n) + 0*0 + c(2)*x(n-2) + 0*0 +$$
$$\ldots + 0*0 + c(26)*x(n-26) + 1*0 + c(28)*x(n-28) +$$
$$0*0 + \ldots + c(52)*x(n-52) + 0*0 + c(54)*x(n-54)$$

as the zero samples at the input following the transposition and the zero coefficients are superposed and y(n) is a sum of 28 terms; and $$y(n+1) = c(0)*0 + 0*x(n) + c(2)*0 + 0*x(n-2) + \ldots +$$
$$c(26)*0 + 1*x(n-26) + c(28)*0 + \ldots + 0*x(n-52) + c(54)*0$$

Because of the canceling out of the terms except for one term, either with zero samples or with zero coefficients, y(n+1)=x(n−26). Therefore there is no calculation to be done, just a delay is applied.

Successive samples y(n), y(n+1) on the route Q at the output of the filter $12_Q$ are therefore written similarly depending on the samples x(i) at the input of the filter $12_Q$ because the transposition gives rise to a sample equal at every two samples because of the value of the $2\pi\, f_0 t_i$: y(n)=x(n−27) and y(n+1) is written as a sum of 28 terms.

The decimation of the samples by 2 amounts to only retaining one sample out of 2, i.e. according to the embodiments either y(n) or y(n+1).

In the relevant case described below, it is considered that the samples y(n) are suppressed and the samples y(n+1) are retained, which induces the application of a delay on the route I and of an FIR filter with 28 coefficients as described below.

As the coefficients are symmetrical (c(0)=c(54), c(1)=c(53)=0, c(2)=c(52), . . . ), this therefore implies 14 multiplications.

Figure 2:
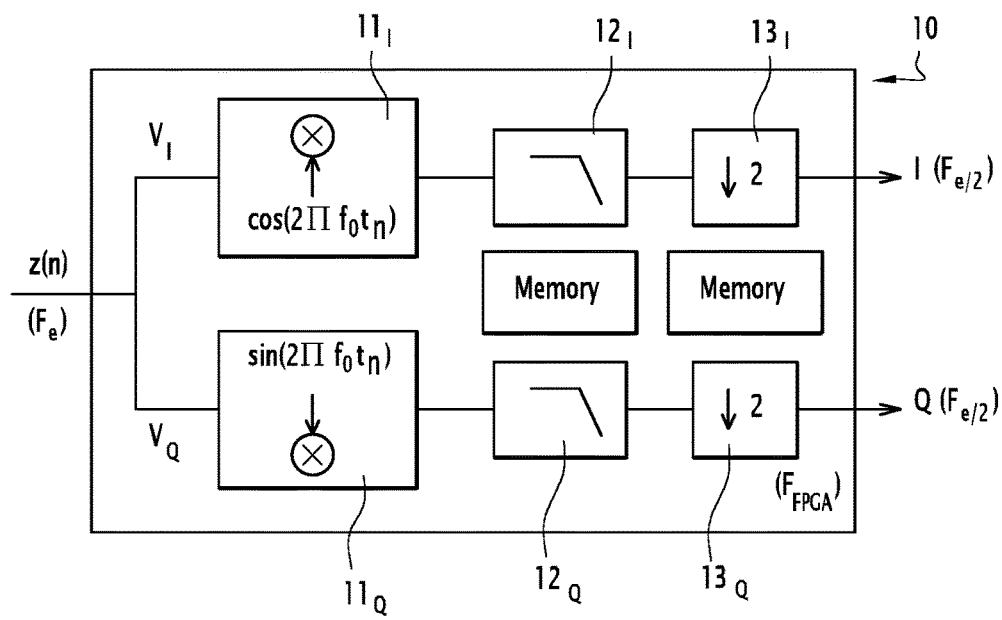
FIG. 2 is a view of a frequency converter of the down type in an embodiment of the invention.
Figure 3:
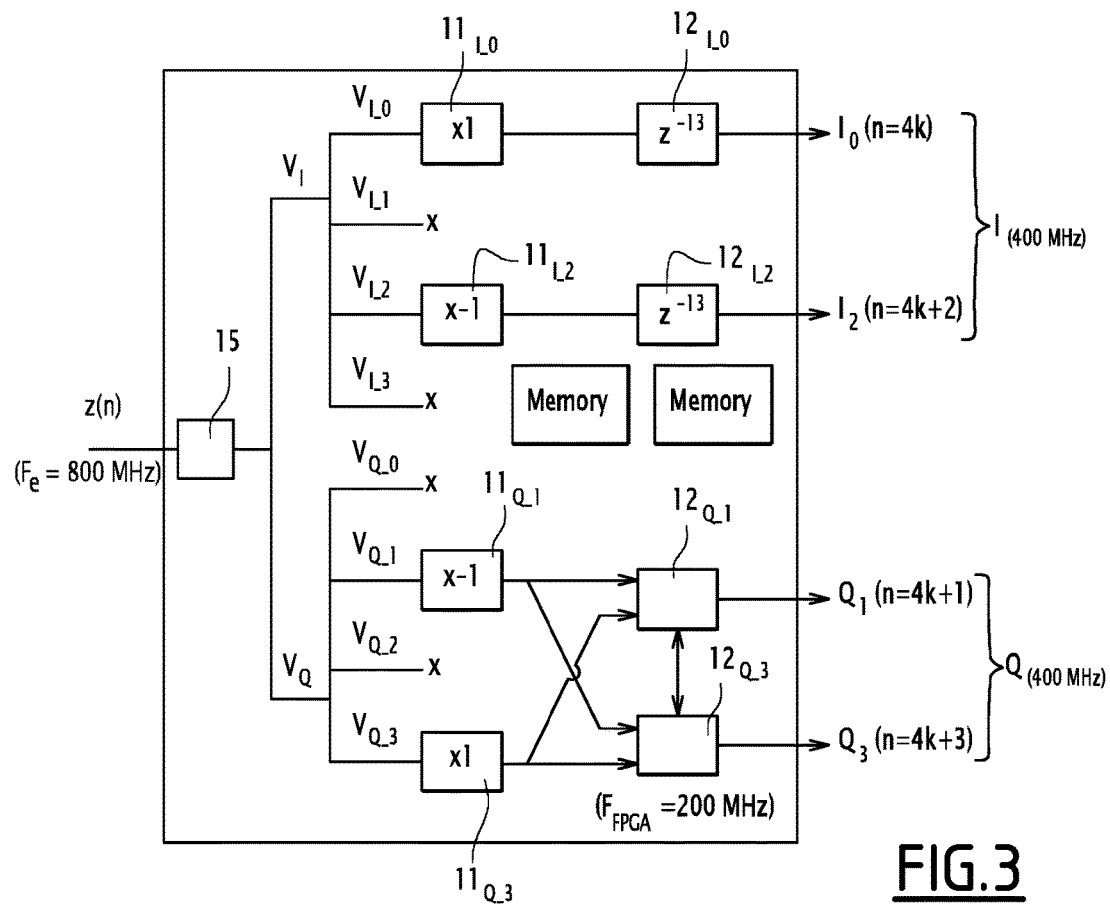
FIG. 3 is a detailed view of a frequency converter of the down type in an embodiment of the invention.

FIG. 3 illustrates a particular embodiment of the DDC 10 illustrated in FIG. 2.

The DDC 10 in this embodiment comprises a distributor 15 adapted for receiving the samples z(n) at the frequency $F_e$=800 MHz and for processing the samples N by N, with N=$F_e/F_{FPGA}$, here N=4.

The processing of this distributor 15 comprises the provision in parallel of each of these N samples at the input of the route $V_I$ and the provision in parallel of each of these N samples at the input of the route $V_Q$.

The route $V_I$ of the DDC 10 thereby comprises N sub-routes $V_{I\_0}$, $V_{I\_N-1}$.

Each sub-route $V_{I\_i}$ i=0 to N−1, selectively receives the samples z(kN+i), with k being a natural integer.

Each sub-route $V_{I\_i}$ is adapted for carrying out in parallel the other sub-routes of the route $V_I$, frequency transposition in a base band by multiplication with $\cos(2\pi\, f_0 t_n)$ in a transposition block in a base band $11_{I\_i}$ and the FIR filtering by a filtering block $12_{I\_i}$.

Similarly, the route $V_Q$ of the DDC 10 thereby comprises N sub-routes $V_{Q\_0}$, . . . , $V_{Q\_N-1}$.

Each sub-route $V_{Q\_i}$ i=0 to N−1, selectively receives the samples z(kN+i), with k being a natural integer.

Each sub-route $V_{Q\_i}$ is adapted for carrying out in parallel the other sub-routes of the route $V_Q$, the frequency transposition in a base band by the multiplication by $-\sin(2\pi\, f_0 t_n)$ in a transposition block in a base band $11_{Q\_i}$, and the FIR filtering by a filtering block $12_{Q\_i}$.

The filtering blocks $12_{Q\_1}$ and $12_{Q\_3}$ are further adapted for calculating and storing in memory the intermediate results, for example in shift registers and communicating between them these intermediate results, for example via input/output means of said access registers.

In the relevant particular case with the values indicated above for p and the frequencies, because $F_e/f_0$=4, it is found that the base band transposition on the sub-routes $V_{I\_1}$, $V_{I\_3}$, $V_{Q\_0}$, and $V_{Q\_2}$ always delivers a zero value. Accordingly, in the relevant particular case, the DDC 10 only includes in reality in each of the routes $V_I$ and $V_Q$ N/2=2 sub-routes: $V_{I\_0}$ and $V_{I\_2}$ in the route $V_I$ and $V_{Q\_1}$ and $V_{Q\_3}$ in the route $V_Q$.

In the relevant embodiment, because $F_e/f_0$=4, $t_n$=n/$F_e$ and signals received on each sub-route:
- on route $V_{I\_0}$, multiplication by $\cos(2\pi\, f_0 t_n)$ in the transposition block in a base band $11_{I\_0}$ is equivalent to the multiplication by a factor 1;
- on route $V_{I\_2}$, the multiplication by $\cos(2\pi\, f_0 t_n)$ in the transposition block in a base band $11_{I\_2}$ is equivalent to the multiplication by a factor −1;
- on the route $V_{Q\_1}$, the multiplication by $-\sin(2\pi\, f_0 t_n)$ in the transposition block in a base band $11_{Q\_1}$ is equivalent to the multiplication by a factor −1;
- on the route $V_{Q\_3}$, the multiplication by $-\sin(2\pi\, f_0 t_n)$ in the transposition block in a base band $11_{Q\_3}$ is equivalent to multiplication by a factor 1.

On the sub-routes $V_{I\_0}$ and $V_{I\_2}$, application of the filtering is equivalent to the application of a delay by applying the transfer function $z^{-13}$: if the output of the filter on the sub-route $V_{I\_0}$ is called $I_0$ and the output of the filter on the sub-route $V_{I\_2}$ is called $I_2$: $I_0$(n=4k)=z(n−14) and $I_2$(n=4k+2)=z(n−12). Indeed, the theoretical delay corresponds to p−1 (=26) as indicated earlier divided by two subsequent to the decimation operation, i.e. (p−1)/2 (=13); as the filtering calculation on the route Q lasts for a longer time than 13 clock cycles, the route I is further delayed so as to be synchronized with the route Q.

The samples from the passing in the base band of route $V_{Q\_1}$ and of the route $V_{Q\_3}$ are provided at the input of each FIR filtering block $12_{Q\_1}$ and $12_{Q\_3}$.

The filtering block $12_{Q\_1}$ on the sub-route $V_{Q\_1}$ is adapted for determining the result of the linear combination; if the output of the filter on the sub-route $V_{Q\_1}$ is called $Q_1$ I:

$Q_1$(n=4k+1)=−c(0)z(4k+1)+c(2)z(4k−1)−c(4)z(4k−3) . . . +c(26)z(4k−25)−c(26)z(4k−27) . . . −c(0)z(4k−53).

To do this, it is adapted for calculating each term of the first half of the linear combination, i.e. the terms c(0)z(4k+1), c(2)z(4k−1), c(4)z(4k−3) . . . , c(26)z(4k−25) depending on the coefficients of the filter c(0), c(26) and on the received base band samples −z(4k+1), +z(4k−1) . . . , z(4k−25), and for storing in memory as an intermediate result the result of each of these terms. Each of these intermediate results stored in memory is made accessible additionally to the filtering block $12_{Q\_3}$.

The filtering block $12_{Q\_1}$ is further adapted for extracting from the memories in which they were stored previously, the terms of the second half of the linear combination, i.e. c(26)z(4k−27), c(24)z(4k−29), . . . ,c(0)z(4k−53), and for determining the sum of the terms of the first half and of the terms of the second half in return for taking into account the signs of these terms.

Similarly, the filtering block $12_{Q\_3}$ on the sub-route $V_{Q\_3}$ is adapted for determining the result of the linear combination; if the output of the filter on the sub-route $V_{Q\_3}$ is called $Q_3$:

$$Q_3(n=4k+3)=c(0)z(4k+3)-c(2)z(4k+1)+c(4)z(4k-1)\ldots-c(26)z(4k-23)+c(26)z(4k-25)\ldots+c(0)z(4k-51).$$

To do this, it is adapted for calculating each term of the first half of the linear combination, i.e. the terms c(0)z(4k+3), c(2)z(4k+1), c(4)z(4k−1) . . . , c(26)z(4k−23) depending on the coefficients of the filter c(0), . . . , c(26) and on the received base band samples z(4k+3), z(4k+1) . . . , −z(4k−23), and for storing in memory as an intermediate result the result of each of these terms. Each of these intermediate results stored in memory is made further accessible to the filtering block $12_{Q\_1}$.

The filtering block $12_{Q\_3}$ is further adapted for extracting from the memories in which they were stored previously, the terms of the second half of the linear combination, i.e. c(26)z(4k−25), c(24)z(4k−27), . . . ,c(0)z(4k−51), and for determining the sum of the terms of the first half and of the terms of the second half in return for the taking into account of the signs of these terms.

The DDC 10 thus delivers simultaneously at the output of the route I, the samples $I_0(n=4k)$ et $I_2(n=4k+2)$, and, at the output of the route Q, the samples $Q_1(n=4k+1)$ and $Q_3(n=4k+3)$.

It is considered that the even samples I of the DDC 10 are provided by the sub-route $I_0$, that the odd samples I of the DDC 10 are provided by the sub-route $I_2$, that the even samples Q of the DDC 10 are provided by the sub-route $Q_1$, that the odd samples Q of the DDC 10 are provided by the sub-route $Q_3$.

The invention proposes, according to an aspect, a processing method in a frequency converter.

Figure 4:
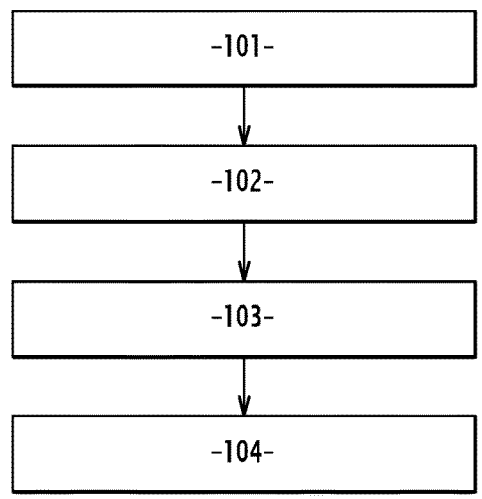
FIG. 4 is a flow chart of steps applied in an embodiment of the invention.

In an embodiment, with reference to FIG. 4, the following steps are applied.

In a step 101, the samples z(n) at the frequency $F_e=800$ MHz are received in the DDC 10 and provided in parallel, N per N, as an input to the route $V_I$ and as an input to the route $V_Q$.

In a step 102, in each sub-route $V_{P\_i}$ in parallel with the other sub-routes of the route $V_P$, the base band frequency transposition by multiplication by $\cos(2\pi f_0 t_n)$ in a base band transposition block $11_{I\_i}$ is carried out, P=I or Q and i=0 to N−1.

Each sub-route $V_{P\_i}$ selectively receives the samples z(kN+i), with k being a natural integer.

The samples from the transposition carried out in a sub-route $V_{P\_i}$ are provided to the other sub-routes of the same route $V_P$.

In a step 103, in each sub-route $V_{P\_i}$ in parallel with the other sub-routes of the route $V_P$, the filtered samples P(kN+i) are determined by means of the formula P(kN+i)=c(0)·x(kN+i)+c(1)·x(kN+i−1)+c(2)·x(kN+i−2)+ . . . −c(p)·x(kN+i−p)+c(p)·x(kN+i−p−1) . . . +c(1)·x(kN+i−2·p+1)+c(0)·x(kN+i−2·p), wherein x(n) is the result of the frequency transposition of the sample z(n).

The intermediate results determined in each sub-route are stored in memory and communicated and/or accessible between sub-routes of a same route for reuse in steps for determining the values of the filtered samples of a higher rank.

In step 104, the samples $I_0(n=4k)$ and $I_2(n=4k+2)$ and, at the output of the route Q, the samples $Q_1(n=4k+1)$ and $Q_3(n=4k+3)$ are simultaneously delivered at the output of the DDC 10.

Of course, the specific embodiments described above with reference to FIG. 3 may also be implemented by the method according to the invention.

The converter according to the present invention therefore gives the possibility of processing in a continuous flow the sampled real samples at $F_e$, here 800 MHz, at the frequency $F_{FPGA}$ for processing FGPA, here 200 MHz, delivering a continuous flow and in real time of samples I at $F_e/2$, here 400 MHz, and delivering a continuous and real time flow of samples Q to $F_e/2$.

Again with reference to the graph of FIG. 1, the area covered by points Z2 is the area which may be utilized in continuous and real time processing according to the invention. The limitation brought by the sampling frequency which may be used for continuous and real time processing corresponds to the maximum sampling rate of the analogue/digital converter upstream from the frequency converter and is no longer limited by the FPGA.

The parallelization of the processing operations on several sub-routes I and several sub-routes Q, the utilization of the properties of the filter and of the storage in memory and reuse of the intermediate results give the possibility both of carrying out the processing operations at reduced rates, which the FPGAs may support, and of limiting the number of required resources.

It will be noted that the parallelization of the processing operations on several sub-routes I and several sub-routes Q may be applied in a converter according to the invention, and this without applying storage in memory and reuse of the intermediate results.

Conversely, the storage in memory and reuse of the intermediate results making use of the properties of the symmetrical filters may be applied in a frequency converter according to the invention without applying parallelization of the processing operations on several sub-routes I and several sub-routes Q. In particular, an application was described above to a frequency converter of the down type, but the utilization of the properties of the symmetrical filters according to the invention may in another embodiment be applied in a up type frequency converter.

In the particular embodiment described above as a reference, a transposed frequency $f_0$ of 200 MHz, a sampling frequency $F_e$ of 800 MHz and a processing frequency $F_{FPGA}$ of 200 MHz were considered. However, the invention may be applied for other values of these frequencies.

As N is equal to the quotient $F_e/F_{FPGA}$, the processing will be typically parallelized on N routes for the route I, and on N routes for the route Q. The processing frequency $F_{FPGA}$ thus sets the number N of parallel routes to be set into place, which may thus be equal notably to a power of 2: 2, 4, 8, 16 etc.

In embodiments, the value of the transposed frequency $f_0$ will further be set equal to $F_e/4$, like in the particular embodiment described, so that all the samples delivered by certain of these parallel routes are systematically zero, so as to thus achieve in a simple way decimation and reduce the number of parallel sub-routes.

Moreover the relevant FIR filter had normalized coefficients relatively to the central coefficient and was symmetrical. The proposed implementation gives the possibility of easily modifying the number of its coefficients. The value of the latter depends on the sampling frequency $F_e$ and is therefore to be adapted accordingly. In other embodiments, the coefficients are not normalized, the reuse of the intermediate results may of course be also applied in this case.

In the case of an embodiment of the invention with a non-symmetrical FIR filter, the intermediate results may not be reused. In this case, the number of multipliers required for applying the filtering is doubled.

The invention claimed is:

1. A frequency converter adapted for receiving signal samples and comprising:
at least one frequency transposition block adapted for transposing in frequency said received samples;
at least one filtering block adapted for filtering said transposed samples and for delivering filtered samples $y(n)$ verifying the formula $y(n)=c(0)\cdot x(n)+c(1)\cdot x(n-1)+c(2)\cdot x(n-2)+\ldots+c(p-1)\cdot x(n-p+1)+c(p)\cdot x(n-p)+c(p-1)\cdot x(n-p-1)+\ldots+\ldots+c(1)\cdot x(n-2\cdot p+1)+c(0)\cdot x(n-2\cdot p)$, wherein $x(\ )$ are transposed samples and $c(0), \ldots c(p)$ are real coefficients of the filter; and
a set of memories;
said frequency converter being adapted for, during a cycle for determining the value of the filtered sample $y(n)$, carrying out operations for
calculating the first terms $c(0)\cdot x(n), c(1)\cdot x(n-1), c(2)\cdot x(n-2), \ldots, c(p)\cdot x(n-p)$ by multiplying the respective coefficients and transposed samples, and storing at least certain of said first calculated terms in the set of memories;
reading, in the set of memories, at least certain of the second terms $c(p-1)\cdot x(n-p-1), \ldots, c(1)\cdot x(n-2\cdot p+1), c(0)\cdot x(n-2\cdot p)$, calculated and stored during the previous cycles for determining the value of filtered samples $y(n-m)$, with m being a strictly positive integer; and
determining $y(n)$ by summation of the first and second terms;
wherein said frequency converter is also adapted for receiving sampled real signal samples and for delivering complex signals I/Q, from the filtering by the filtering block after transposition with the transposition block of said sampled real samples,
said converter including parallel chains for processing of the signals I and of the signals Q, at least one of said processing chains I, Q comprising N parallel routes each adapted for carrying out frequency transposition, said frequency converter being adapted for selectively distributing the real samples between said routes, each $(N\cdot n+i-1)^{th}$ real sample being provided to the $i^{th}$ route, i=1 to N, n being a positive integer,
at least the $k^{th}$ and $j^{th}$ parallel routes of said processing chain ($V_Q$), k≠j and k, j integers between 1 and N, comprising a filtering sub-block adapted for determining the filtered signal $y(N\cdot n+i-1)=c(0)\cdot x(N\cdot n+i-1)+c(1)\cdot x(N\cdot n+i-1-1)+c(2)\cdot x(N\cdot n+i-1-2)+\ldots+c(p-1)\cdot x(N\cdot n+i-p)+c(p)\cdot x(N\cdot n+i-1-p)+c(p-1)\cdot x(N\cdot n+i-1-p-1)\ldots+c(1)\cdot x(N\cdot n+i-1-2\cdot p+1)+c(0)\cdot x(N\cdot n+i-1-2\cdot p)$, wherein $x(\ )$ are signals from the transposition in said processing chain, with i=j on the $j^{th}$ route, and i=k on the $k^{th}$ route,
the filtering sub-block of the $k^{th}$ route, respectively of the $j^{th}$ route, being adapted for calculating the first terms $c(0)\cdot x(N\cdot n+i-1), \ldots, c(p)\cdot x(N\cdot n+i-1-p)$ by multiplying the respective coefficients and transposed samples, in order to store at least certain of said first terms calculated in the set of memories and for reading, in the set of memories, at least certain of the second terms $c(p-1)\cdot x(N\cdot n+i-1-p-1), \ldots, c(0)\cdot x(N\cdot n+i-1-2\cdot p)$, calculated and stored during previous cycles for determining the value of filtered samples $y(n-m)$, with m being a strictly positive integer, certain of said second terms having been calculated by the filtering sub-block of the $j^{th}$ route, respectively of the $k^{th}$ route.

2. The frequency converter according to claim 1, adapted for operating in a way clocked by a clock frequency signal, a so called operating frequency, and adapted for receiving the real samples sampled according to a sampling frequency, N being equal to the quotient of the sampling frequency by the operating frequency.

3. The frequency converter according to claim 2, wherein the frequency transposition comprises a multiplication of the samples with a sine or cosine of frequency equal to $F_e/4$, N/2 routes thereby delivering always zero transposed samples.

4. The processing method in a frequency converter adapted for receiving signal samples, the method comprising:
receiving the signal samples;
transposing in frequency said received samples;
filtering said transposed samples, the filtered samples $y(n)$ verifying the formula $y(n)=c(0)\cdot x(n)+c(1)\cdot x(n-1)+c(2)\cdot x(n-2)+\ldots+c(p-1)\cdot x(n-p+1)+c(p)\cdot x(n-p)+c(p-1)\cdot x(n-p-1)+\ldots+\ldots+c(1)\cdot x(n-2\cdot p+1)+c(0)\cdot x(n-2\cdot p)$, wherein $x(\ )$ are the transposed samples and $c(0), \ldots c(p)$ are the real coefficients of the filter;
said processing method comprising, during a cycle for determining the value of the filtered sample $y(n)$:
calculating the first terms $c(0)\cdot x(n), c(1)\cdot x(n-1), c(2)\cdot x(n-2), \ldots, c(p)\cdot x(n-p)$ by multiplying the respective coefficients and transposed samples, and storing at least certain of said first terms calculated in a set of memories;
reading, in the set of memories, at least certain of the second terms $c(p-1)\cdot x(n-p-1), \ldots, c(1)\cdot x(n-2\cdot p+1), c(0)\cdot x(n-2\cdot p)$, calculated and stored during previous cycles for determining the value of filtered samples $y(n-m)$, with m being a strictly positive integer; and
determining $y(n)$ by summation of the first and second terms;
the frequency converter being adapted for receiving sampled real signal samples and delivering complex I/Q signals from the filtering after transposition of said sampled real samples, said method comprising:
processing in parallel the real samples on a processing chain I for signals I and a Q processing chain for signals Q;
on at least one of said parallel processing chains comprising N parallel routes, selective distribution of the real samples among said routes, each real $(N\cdot n+i-1)^{th}$ sample being provided to the $i^{th}$ route, i=1 to N, n being a positive integer,
the processing method comprising, on at least the $k^{th}$ and $j^{th}$ parallel routes of said processing chain ($V_Q$), k≠j and k, j integers between 1 and N, the determination of the filtered signal $y(N\cdot n+i-1)=c(0)\cdot x(N\cdot n+i-1)+c(1)\cdot x(N\cdot n+i-1-1)+c(2)\cdot x(N\cdot n+i-1-2)+\ldots+c(p-1)\cdot x(N\cdot n+i-p)+c(p)\cdot x(N\cdot n+i-1-p)+c(p-1)\cdot x(N\cdot n+i-1-p-1)\ldots+c(1)\cdot x(N\cdot n+i-1-$ $2 \cdot p+1)+c(0) \cdot x(N \cdot n+i-1-2 \cdot p)$, wherein $x(\ )$ are signals from the transposition in said processing chain, with $i=j$ on the $j^{th}$ route, and $i=k$ on the $k^{th}$ route, and comprising on the $k^{th}$ route, respectively the $j^{th}$ route, the calculation of the first terms $c(0) \cdot x(N \cdot n+i-1), \ldots, c(p) \cdot x(N \cdot n+i-1-p)$ by multiplying the respective coefficients and transposed samples, the storage of at least certain of said first calculated terms in the set of memories and the reading in the set of memories, of at least certain of the second terms $c(p-1) \cdot x(N \cdot n+i-1-p-1), \ldots, c(0) \cdot x(N \cdot n+i-1-2 \cdot p)$, calculated and stored during previous cycles for determining the value of filtered samples $y(n-m)$, with m being a strictly positive integer, on the $j^{th}$ route, respectively the $k^{th}$ route.

5. The processing method according to claim 4, according to which the processing operation is clocked by a clock frequency signal, a so called operating frequency, and according to which the sampled real samples are received according to a sampling frequency, and N is equal to the quotient of the sampling frequency by the operating frequency.

6. The processing method according to claim 5, according to which the frequency transposition comprises a multiplication of the samples by a sine or cosine of frequency equal to $F_e/4$, N/2 routes thereby delivering always zero transposed samples.

* * * * *